(12) United States Patent
Shah et al.

(10) Patent No.: US 11,885,021 B2
(45) Date of Patent: Jan. 30, 2024

(54) GAS SUPPLY MEMBER WITH BAFFLE

(71) Applicant: Applied Materials, Inc., Santa Clara, CA (US)

(72) Inventors: Kartik Shah, Saratoga, CA (US); Vishwas Kumar Pandey, Madhya Pradesh (IN); Kailash Pradhan, Campbell, CA (US); Sairaju Tallavarjula, Santa Clara, CA (US); Rene George, San Carlos, CA (US); Eric Kihara Shono, San Mateo, CA (US); Philip A. Bottini, Santa Clara, CA (US); Roger Curtis, Stockton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/317,418

(22) Filed: May 11, 2021

(65) Prior Publication Data

US 2021/0262093 A1 Aug. 26, 2021

Related U.S. Application Data

(62) Division of application No. 16/049,239, filed on Jul. 30, 2018, now Pat. No. 11,124,878.

(30) Foreign Application Priority Data

Jul. 31, 2017 (IN) .............................. 201741027099

(51) Int. Cl.
*C23C 16/455* (2006.01)
*H01L 21/67* (2006.01)
(Continued)

(52) U.S. Cl.
CPC ...... *C23C 16/45591* (2013.01); *C23C 14/564* (2013.01); *C23C 14/566* (2013.01);
(Continued)

(58) Field of Classification Search
CPC .......... C23C 16/4401; C23C 16/45563; C23C 16/45591; C23C 14/564; C23C 14/566; F16K 51/02; H01L 21/67126
See application file for complete search history.

(56) References Cited

U.S. PATENT DOCUMENTS

| 5,888,591 A | 3/1999 | Gleason et al. |
| 5,997,588 A | 12/1999 | Goodwin et al. |

(Continued)

FOREIGN PATENT DOCUMENTS

| CN | 102017068 A | 4/2011 |
| CN | 105556640 A | 5/2016 |

(Continued)

OTHER PUBLICATIONS

Korean Office Action dated Apr. 19, 2021, for Korean Patent Application No. 2020-7005641.

(Continued)

*Primary Examiner* — Dah-Wei D. Yuan
*Assistant Examiner* — Stephen A Kitt
(74) *Attorney, Agent, or Firm* — Patterson + Sheridan, LLP

(57) ABSTRACT

A gas supply member includes a first side opposite a second side and an inner surface defining a first opening extending between the first and second sides. The gas supply member includes a third side orthogonal to the first side, the third side includes a first extension that has a face partially defining the second side, and the first extension includes a first plurality of holes extending through the first extension to the face. The gas supply member includes a fourth side opposite the (Continued)

third side, the fourth side includes a protrusion that has a face partially defining the second side. The gas supply member also includes a baffle disposed adjacent to the inner surface, the baffle includes a first portion extending from the inner surface and a second portion attached to the first portion, and the second portion orthogonal to the first portion and parallel to the third side.

19 Claims, 8 Drawing Sheets

(51) Int. Cl.
  *C23C 14/56* (2006.01)
  *C23C 16/44* (2006.01)
(52) U.S. Cl.
  CPC .... *C23C 16/4401* (2013.01); *C23C 16/45563* (2013.01); *H01L 21/67126* (2013.01)

(56) References Cited

U.S. PATENT DOCUMENTS

| | | | |
|---|---|---|---|
| 6,010,967 A | 1/2000 | Donohoe et al. | |
| 6,045,620 A | 4/2000 | Tepman et al. | |
| 6,056,267 A | 5/2000 | Schneider | |
| 6,089,543 A * | 7/2000 | Freerks | F16K 3/0227 251/356 |
| 6,093,655 A | 7/2000 | Donohoe et al. | |
| 6,602,346 B1 | 8/2003 | Gochberg et al. | |
| 6,800,172 B2 | 10/2004 | Carpenter et al. | |
| 7,585,370 B2 | 9/2009 | Gochberg et al. | |
| 7,754,014 B2 | 7/2010 | Gochberg et al. | |
| 2002/0033183 A1 | 3/2002 | Sun et al. | |
| 2003/0066541 A1 | 4/2003 | Sun et al. | |
| 2008/0168947 A1* | 7/2008 | Gochberg | H01L 21/67126 118/733 |
| 2008/0296304 A1 | 12/2008 | Tran et al. | |
| 2009/0163001 A1 | 6/2009 | Bauer | |
| 2012/0152900 A1 | 6/2012 | Chebi et al. | |
| 2013/0153807 A1 | 6/2013 | Balasubramanyam et al. | |
| 2014/0060433 A1 | 3/2014 | Carlson et al. | |
| 2014/0060434 A1 | 3/2014 | Carlson et al. | |
| 2014/0097270 A1 | 4/2014 | Liang et al. | |
| 2014/0099794 A1 | 4/2014 | Ingle et al. | |
| 2015/0267299 A1 | 9/2015 | Hawkins et al. | |
| 2016/0358792 A1 | 12/2016 | Madiwal et al. | |
| 2019/0032216 A1 | 1/2019 | Shah et al. | |

FOREIGN PATENT DOCUMENTS

| | | |
|---|---|---|
| JP | H4228978 A | 8/1992 |
| JP | 2001509647 A | 7/2001 |
| JP | 2003502501 A | 1/2003 |
| JP | 3107055 U | 1/2005 |
| JP | 2005340784 A | 12/2005 |
| JP | 2006100792 A | 4/2006 |
| JP | 2010272889 A | 12/2010 |
| JP | 2014074190 A | 4/2014 |
| JP | 6452230 | 1/2019 |
| KR | 10-2001-0021746 A | 3/2001 |
| KR | 20060117613 A | 11/2006 |
| KR | 100703650 B1 | 3/2007 |
| KR | 10-2008-0105951 A | 12/2008 |
| KR | 10-2015-0108755 A | 9/2015 |
| TW | M490189 U | 11/2014 |

OTHER PUBLICATIONS

Japanese Decision to Grant a Patent dated Aug. 3, 2021, for Japanese Patent Application No. 2020-504012.
Korean Office Action dated Jan. 13, 2022 for Application No. 10-2021-7042055.
PCT International Search Report/Written Opinion dated Oct. 31, 2018 for Application No. PCT/US2018/044293.
Japanese Office Action dated Apr. 6, 2021 for Application No. 2020-504012.
Japanese Office Action dated Oct. 18, 2022 for Application No. 2021-142485.
Korean Office Action dated Oct. 24, 2022 for Application No. 10-2022-7029184.
Taiwan Office Action dated Sep. 7, 2022 for Application No. 111104449.
Korean Office Action dated Mar. 23, 2023 for Application No. 10-2022-7029184.

* cited by examiner

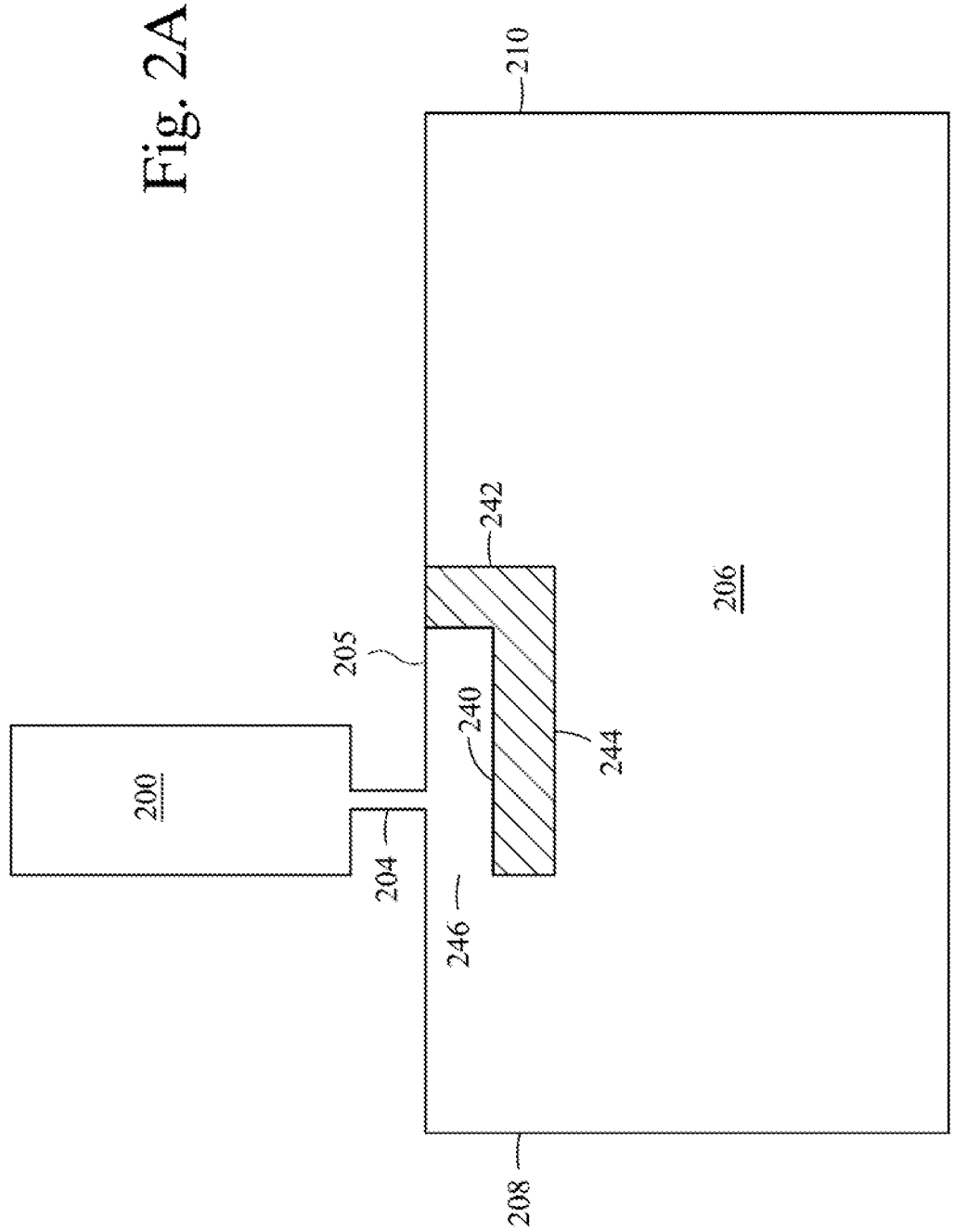

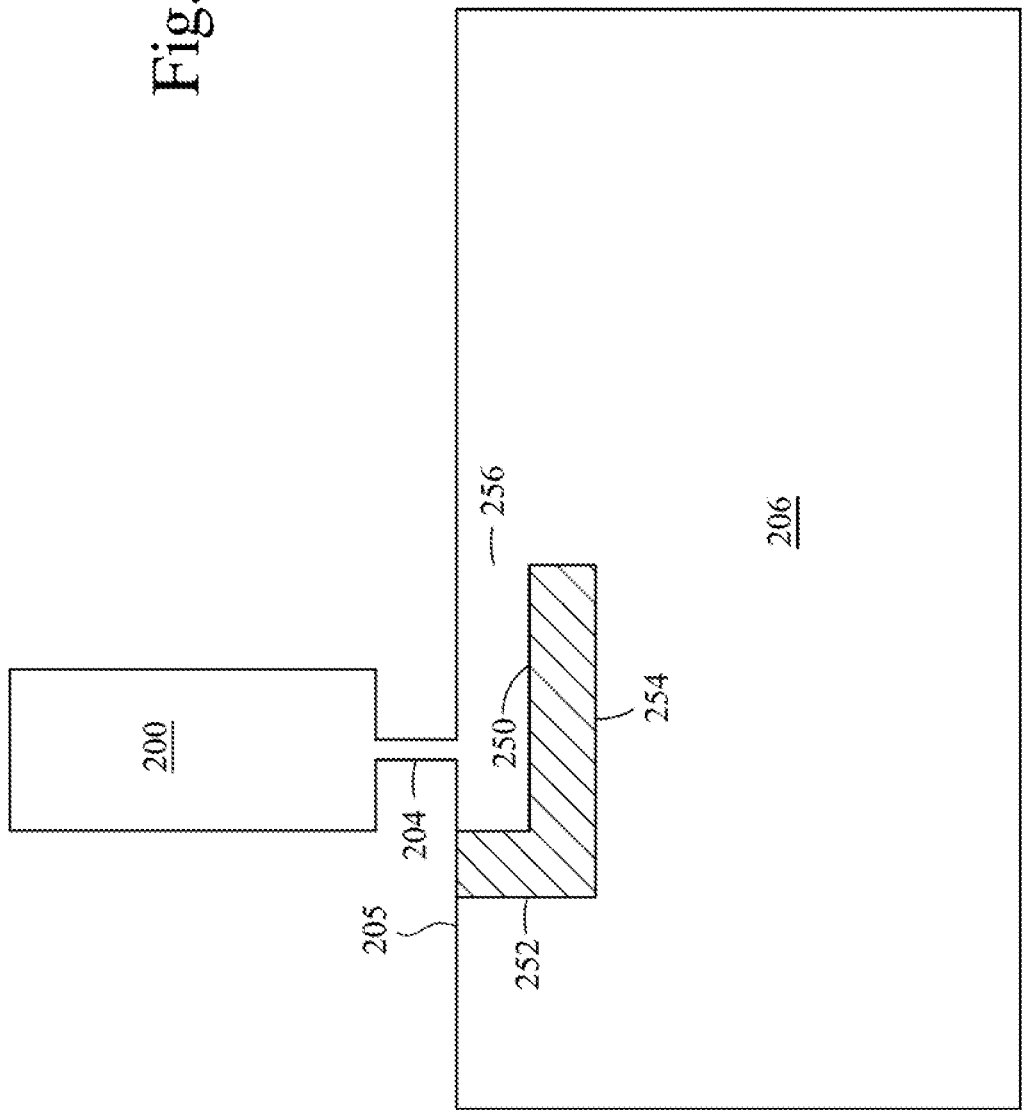

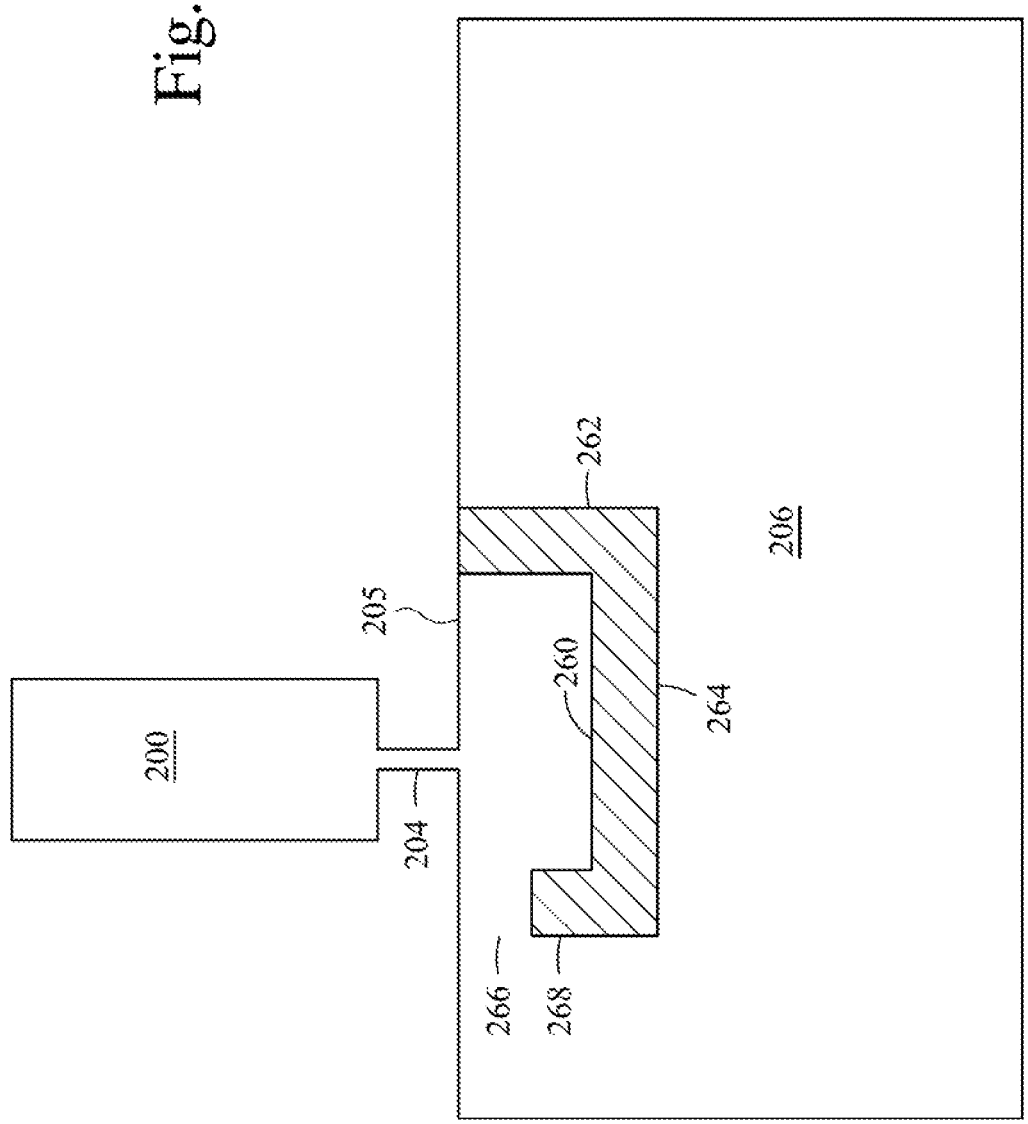

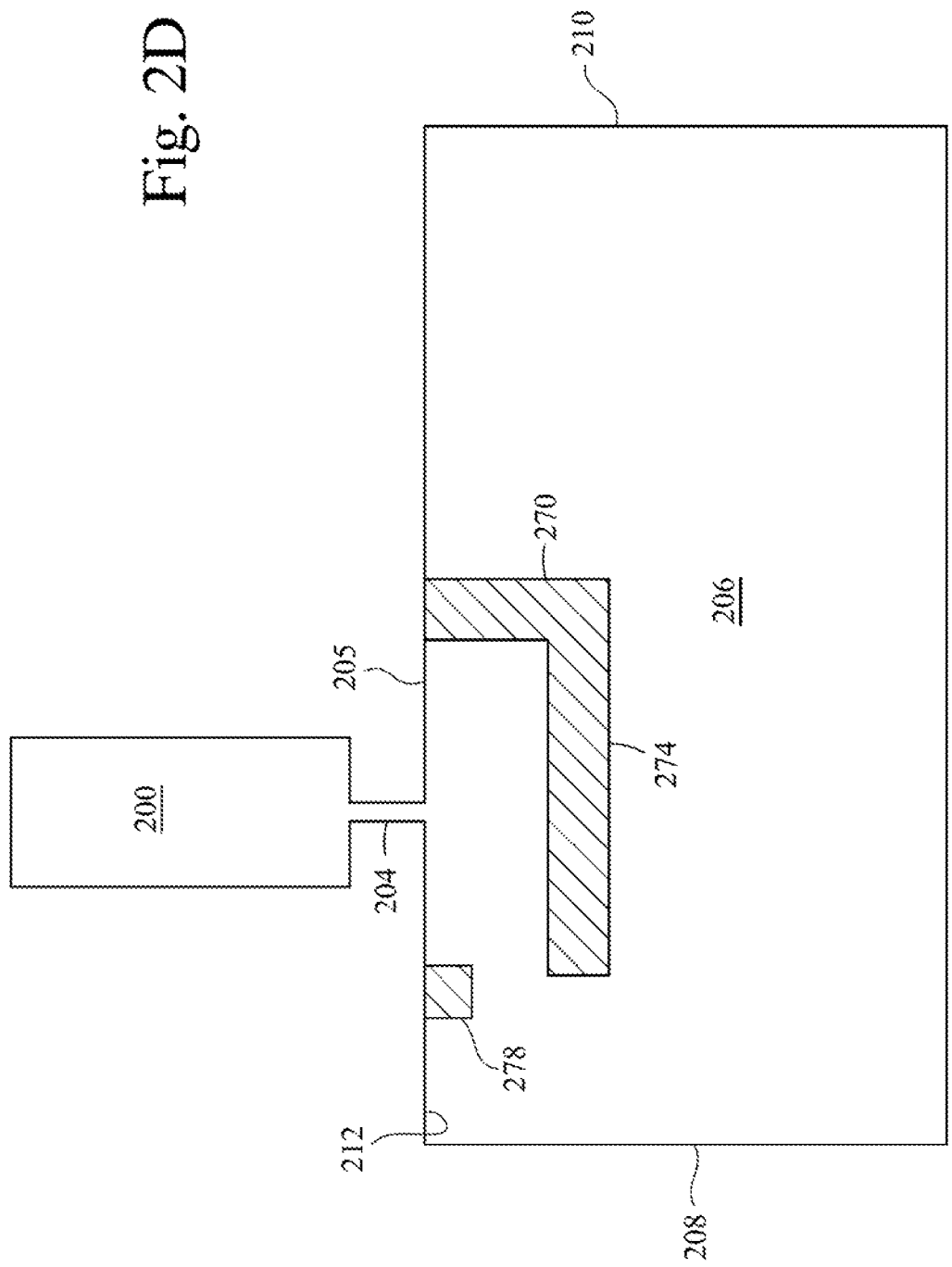

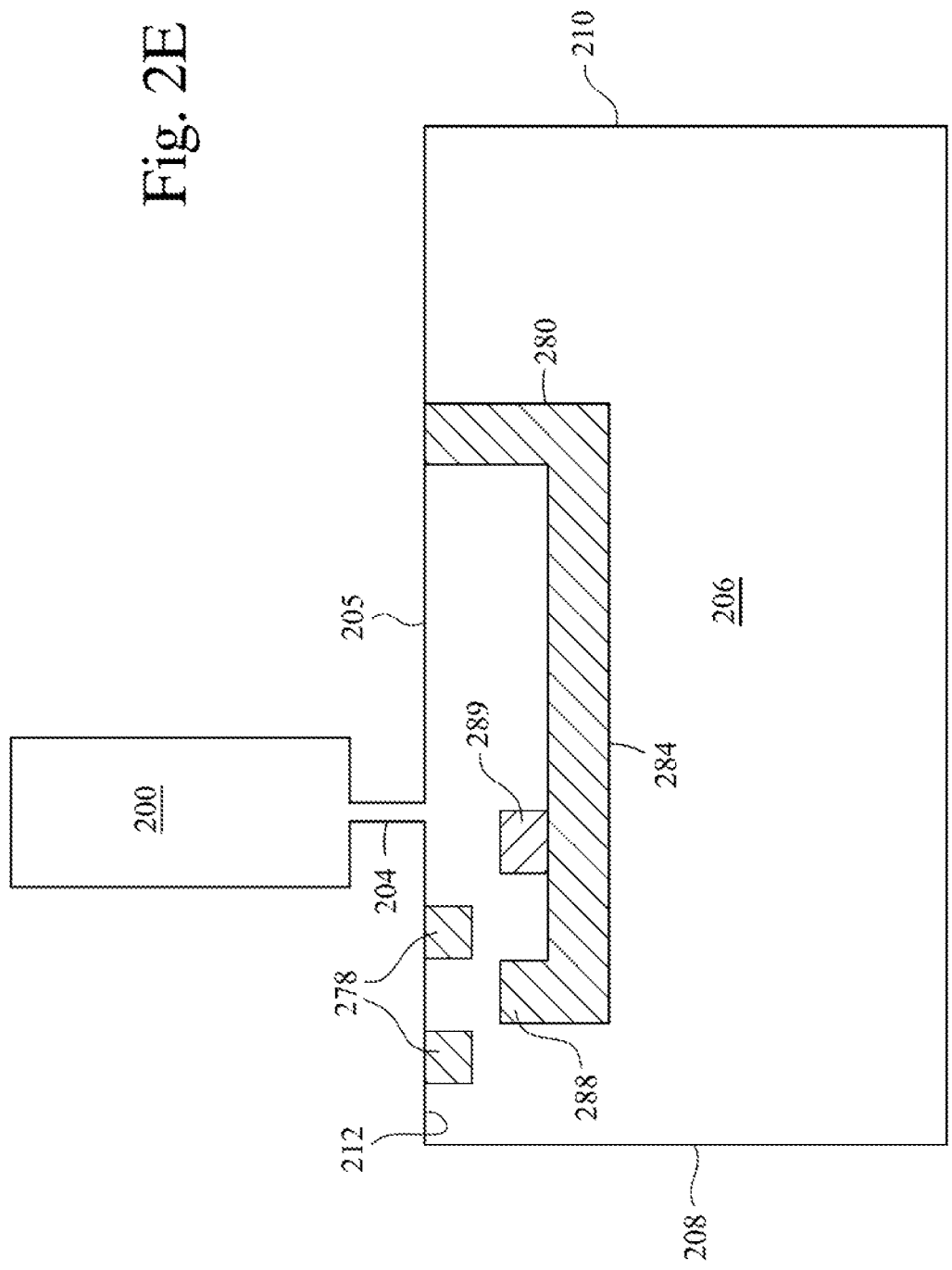

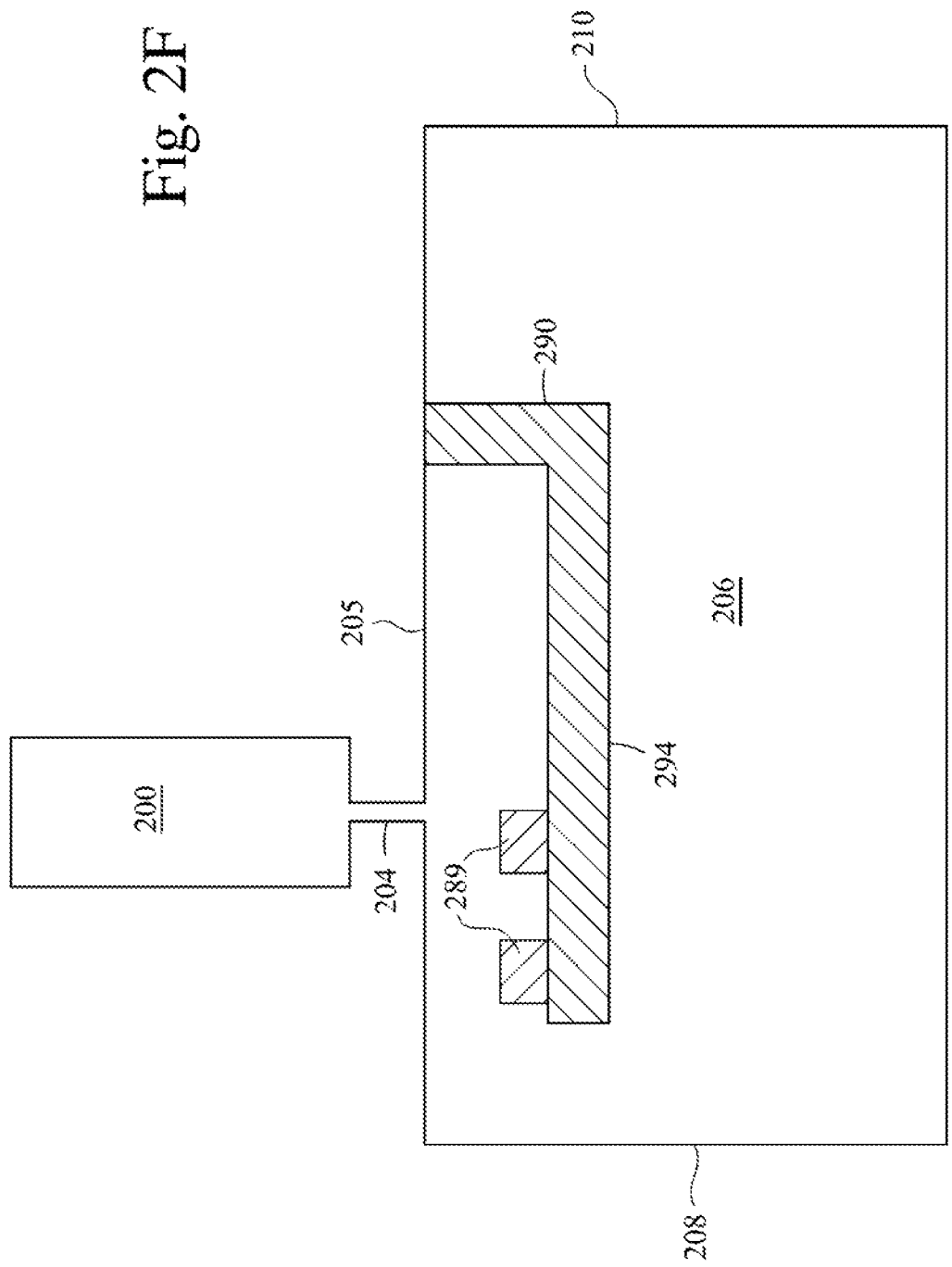

GAS SUPPLY MEMBER WITH BAFFLE

CROSS-REFERENCE TO RELATED APPLICATIONS

This application is a divisional of U.S. application Ser. No. 16/049,239, filed Jul. 30, 2018, which claims priority to Indian Prov. Appl. No. 201741027099, filed Jul. 31, 2017, which are herein incorporated by reference in their entirety.

BACKGROUND

Field

Embodiments described herein generally relate to a gas supply member providing for uniform flow of fluid.

Description of the Related Art

Processing systems for manufacturing integrated circuits on substrates may have a load lock chamber to transport substrates into a processing chamber. Access between chambers is provided through a slit valve. The slit valve includes an opening in the processing chamber through which a substrate can pass. The actual opening for a slit valve in the side of some chambers is typically a generic rectangular hole that does not match up with the slit valve of the processing chamber. Thus, a slit valve insert is inserted to act as an adapter. The slit valve door covers the opening of the slit valve insert during processing. The slit valve is in fluid connection with a gas inject and a tunnel. The tunnel directs gas flow towards the substrate as process gases enter the processing chamber at a high velocity through the gas inject. The momentum of the gas flow carries the process gases to the substrate where deposition occurs. The gas flows from the gas inject to the tunnel and towards the substrate.

Variations in process conditions can affect the gas flow pathway and thus deposition uniformity. One such process condition affecting gas flow path is the angle of the slit valve door and/or change in shape of the slit valve door as the door becomes dirty or contaminated during the opening and closing cycles of the slit valve. The changes in the flow as the gas comes in contact with the slit valve door effect deposition on a substrate. The variations in deposition affect uniformity.

Therefore, there is a need for an improved gas supply member capable of providing a uniform gas flow pathway irrespective of the shape or condition of the slit valve insert.

SUMMARY

Embodiments described herein generally relate to a gas supply member providing for uniform flow of fluid. In one embodiment, the gas supply member includes a first side, a second side opposite the first side, a first inner surface defining a first opening, a third side orthogonal to the first side, a fourth side opposite the third side, and a baffle disposed adjacent to the inner surface defining the opening. The first opening extends between the first side and the second side. The third side includes a first extension. The first extension has a face partially defining the second side and the first extension includes a first plurality of holes extending through the first extension to the face. The fourth side includes a protrusion. The protrusion has a face partially defining the second side. The baffle includes a first portion extending from the inner surface, and a second portion attached to the first portion. The second portion is orthogonal to the first portion and parallel to the third side.

In another embodiment, a gas supply member is disclosed. The gas supply member includes a first side, a second side opposite the first side, a first inner surface defining a first opening, a third side orthogonal to the first side, a fourth side opposite the third side, and a baffle disposed adjacent to the inner surface defining the opening. The first opening extends between the first side and the second side. The third side includes a first extension. The first extension has a face partially defining the second side and the first extension includes a first plurality of holes extending through the first extension to the face. The fourth side includes a protrusion. The protrusion has a face partially defining the second side. The baffle includes a first portion extending from the inner surface, a second portion attached to the first portion, and a cavity. The second portion is orthogonal to the first portion and parallel to the third side. The cavity is formed between the first portion and the first side.

In another embodiment, a gas supply member is disclosed. The gas supply member includes a first side, a second side opposite the first side, a first inner surface defining a first opening, a third side orthogonal to the first side, a fourth side opposite the third side, and a baffle disposed adjacent to the inner surface defining the opening. The first opening extends between the first side and the second side. The third side includes a first extension. The first extension has a face partially defining the second side and the first extension includes a first plurality of holes extending through the first extension to the face. The fourth side includes a protrusion. The protrusion has a face partially defining the second side. The baffle includes a first portion extending from the inner surface, a second portion attached to the first portion, and a cavity. The second portion is orthogonal to the first portion and parallel to the third side. The cavity is formed between the first portion and the second side.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of scope, for the disclosure may admit to other equally effective embodiments.

FIGS. 2A-2F show a gas flow models according to embodiments described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to a gas supply member. In one embodiment, the gas supply member includes a first side, a second side opposite the first side, a first inner surface defining an opening, a third side orthogonal to the first side, a fourth side opposite the third side, and a baffle adjacent to the inner surface. The opening extends between the first side and the second side. The third side includes a first extension with a face partially defining the second side and a first plurality of holes extending through the first extension to the face. The fourth side includes a protrusion with a face partially defining the second side. The baffle includes a connecting wall extending from the inner surface and a diverter wall connected to the connecting wall. By providing a barrier, the baffle directs the process gases towards the substrate for a more uniform deposition. In some cases, the substrate is disposed in a processing chamber that features a rotatable substrate support, where the gas is directed to flow across the substrate.

Figure 1A:
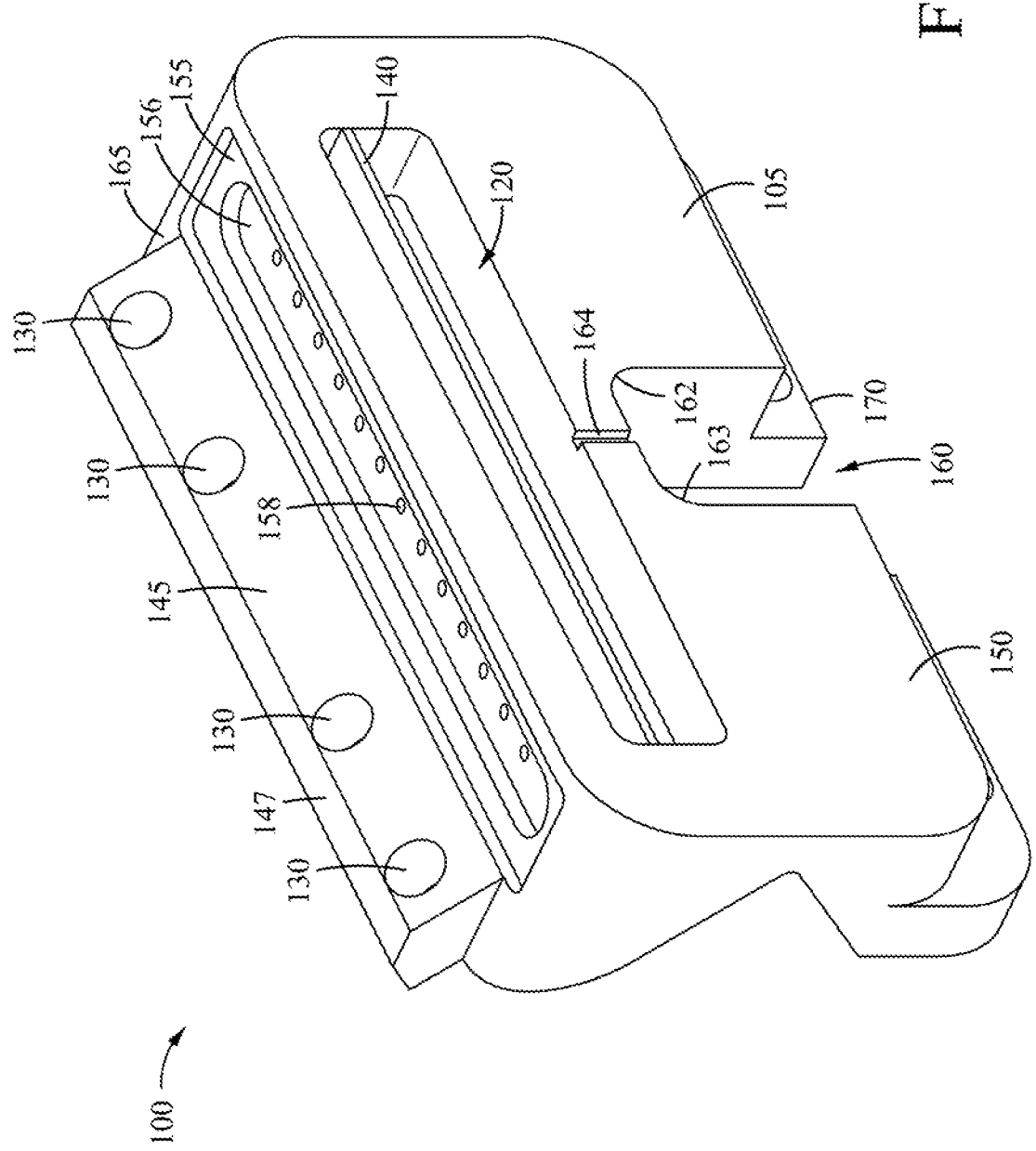
FIG. 1A shows a front view gas supply member according to one embodiment described herein.

FIG. 1A shows a front view of a gas supply member 100 according to one embodiment described herein. In one embodiment, the gas supply member 100 is a slit valve insert. The gas supply member 100 may be used in any suitable process or processing chamber, such as a furnace, a temperature-controlled chamber, or a chemical vapor deposition (CVD) chamber and/or process. One suitable chamber that may be used to is a VANTAGE® RADOX™ RTP chamber available from Applied Materials, Inc., Santa Clara, Calif. Another suitable chamber may be a PRODUCER® CVD chamber also available from Applied Materials, Inc., Santa Clara, Calif. The gas supply member 100 is an adapter that inserts into a processing chamber with a passage for a substrate formed therein. The gas supply member 100 has an opening 120 in a body 105, a baffle 140 in the opening 120, an extension 145 from the body 105, and a depression 155.

The body 105 also includes a front surface 150, a rear surface 110, a top surface 165, and a bottom surface 170. The front surface 150 is opposite the rear surface 110. The top surface 165 may be orthogonal to the front surface 150. In the implementation of FIG. 1A, the top surface 165 has a larger width than the bottom surface 170. In another implementation, the top surface 165 may have a smaller width than the bottom surface 170. In yet another implementation, the top surface 165 may have the same width as the bottom surface 170. The bottom surface 170 is opposite the top surface 165 and may be orthogonal to the front surface 150. When the gas supply member 100 is installed in a processing system, the front surface 150 typically faces an interior of a processing chamber.

An opening 120 is formed in the front surface 150. In some embodiments, the gas supply member 100 is a slit valve insert. In such embodiments, the opening 120 is the opening between the transfer chamber and the processing chamber when the slit valve door is retracted. In other words, when the slit valve door is retracted, a substrate can pass through the opening 120 to enter the processing chamber. In such cases, the opening 120 may be made for varying substrate sizes, e.g., 60 mm, 100 mm, 200 mm, 300 mm, etc. In other embodiments, the gas supply member 100 is an insert in a gas supply conduit that is not associated with a slit valve.

The body 105 includes rounded corners and a centrally located recess 160. For example, the recess 160 is formed in a bottom surface 170 extending towards the opening 120 in a direction perpendicular to the bottom surface 170. The recess 160 includes a vertical gap or slit 164. The recess 160 has rounded corners 162, 163 adjacent to the opening 120. Between the rounded corners 162, 163 is the vertical slit 164. The vertical slit extends from the recess 160 to the opening 120. The vertical slit 164 is disposed about equidistant from each of the rounded corners 162, 163. The vertical slit 164 is perpendicular to the bottom surface 170. The extension 145 may be disposed opposite the recess 160. The extension 145 is disposed on the top surface 165 of the body 105. The extension 145 has an angled or curved surface facing the front surface 150 and an angled surface 146 facing the rear surface 115. The base of the extension 145 is attached to the top surface 165 of the body 105. The extension includes an edge 147 opposite the base. The thickness of the extension 145 at the base is larger than the thickness at the edge 147. The extension 145 includes a plurality of holes 130. The holes 130 extend to the rear surface 110, as illustrated in FIG. 1B.

The depression 155 is adjacent to the extension 145 on the top surface 165 of the body 105. The depression 155 includes an elongated recess 156. At the bottom of the elongated recess 156 are a plurality of holes 158. In operation, process gas passes through the plurality of holes 158 from a gas inject (not shown) that engages with the recess 156. The elongated recess 156 extends along the length of the top surface 165. The plurality of holes 158 are in fluid communication with the baffle 140. The baffle 140 is disposed adjacent to the opening 120. The baffle 140 extends the length of the gas supply member 100. In one implementation, a portion the baffle 140 extends down from the top surface 165 of the gas supply member 100. That portion is not visible in FIG. 1, but is schematically shown in FIGS. 2A-2F, further described below. In other words the baffle 140 is disposed between the top surface 165 and the opening 120. In operation, the baffle is in fluid connection with the gas inlet and tunnel, as illustrated in FIG. 2A. The baffle 140 may be a shelf that extends into the tunnel. The baffle 140 includes a first portion, which may be a connecting wall, that extends orthogonal to the top surface 165 and a second portion, which may be a diverter wall. The second portion is connected to the first portion and extends parallel to the top surface 165 of the gas supply member 100. In operation, as gas flows from the gas inlet to the tunnel, the baffle 140 disposed in the tunnel provides a break in the gas velocity and momentum before reaching the substrate. Specifically, the gas flow from the inlet and contacts the second portion of the baffle 140. The baffle directs the gas flow in one direction, towards the slit valve door. The baffle 140 is a barrier between the gas inlet and the tunnel.

Figure 1B:
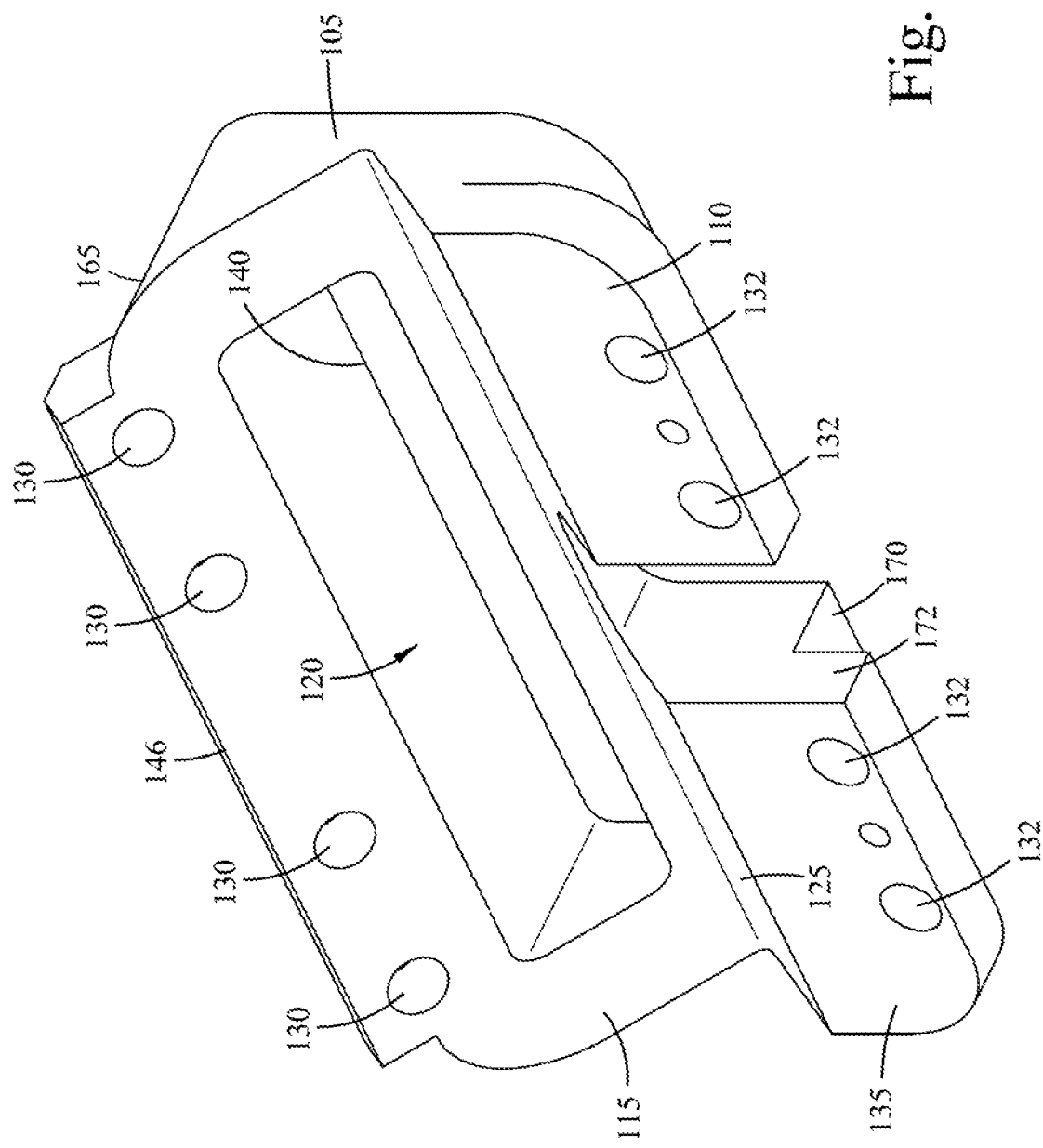
FIG. 1B shows a back view of a gas supply member according to one embodiment described herein.

FIG. 1B shows a back view of a gas supply member 100 according to one embodiment described herein. The opening 120 exposes the baffle 140 which hides openings 158 shown in FIG. 1A. The rear surface 110 of the gas supply member 100 faces the interior of the transfer chamber once inserted. The rear angular surface 115 faces towards the interior of the transfer chamber at a downward angle and forms a slit valve door seat that a slit valve door may be pushed up at an angle from the floor of the processing chamber and form an airtight seal with the rear angular surface 115 to close the slit valve. The rear sloped surface 125 is downward sloping to allow the slit valve door to contact the rear angular surface 115. The rear sloped surface 125 and the rear angular surface 115 project outward from the body 105 forming an acute angle. The rear sloped surface 125 is adjacent a vertical surface 135. The rear angular surface 115 has the plurality of holes 130 disposed adjacent the top surface 165 of the gas supply member 100. The vertical surface 135 have a plurality of holes 132 near the bottom surface 170 of the gas supply member 100. The gas supply member 100 attaches to the processing chamber with fasteners (e.g., screws or bolts) through holes 130, 132. The bottom surface 170 includes a vertical shelf 172. The plurality of holes 132 is disposed in the vertical shelf 172. In cases where the gas supply member 100 is not associated with a slit valve, the rear surface 110 of the gas supply member 100 may face a gas supply source or an exterior surface of the processing system.

FIGS. 2A-2F are schematic diagrams of gas flow features according to embodiments described herein. In each case, a gas flow conduit 200 is shown. The gas flow conduit 200 (not shown in FIG. 1A or 2A) is coupled to a gas inlet 204 (such as the plurality of holes 158 shown in FIG. 1A) which provides gas flow from the gas flow conduit 200 to a tunnel 206 (such as opening 120 shown in FIGS. 1A and 1B) provided thereto and between. The tunnel 206 features one or more baffles 240, 250, 260, 270, 280, and 290 (respectively shown in FIGS. 2A-2F) that project into the tunnel 206 adjacent to the gas inlet 204. The tunnel 206 directs process gas to a substrate disposed in a processing chamber (not shown).

The tunnel 206 has a first end 208 proximate the processing chamber and a second end 210 opposite from the first end 208. In the implementation of FIG. 2A, the baffle 240 together with a wall 205 of the tunnel 206 define an opening 246 that faces toward the first end 208, toward the slit valve door or rear surface. The wall 205 defines an inner surface 212 of the tunnel 206. The baffle 240 has a first portion 242 and a second portion 244 that is orthogonal the first portion 242. The first portion 242 and the second portion 244 extend into the tunnel 206 directly across from the gas inlet 204. The first portion 242 is attached to the wall 205 and extends from the wall 205 into the tunnel 206. The second portion 244 is attached to the first portion 242 at a distal end thereof, and extends along the tunnel 206 toward the first end 208 of the tunnel 206 in the embodiment of FIG. 2A.

As gas enters from the gas inlet 204, the gas contacts the baffle 240. A portion of the gas may flow towards the first portion 242 of the baffle 240. However, since the baffle has one opening 246, the gas contacts the baffle 240, mixes, and then continues to flow towards the first end 208 through the opening 246. After hitting the first end 208 formed with the intersection of the slit valve door (not shown), the gas continues towards the second end 210 of the tunnel 206, and towards a substrate beyond the tunnel 206. The tunnel 206 directs the flow of gas to the substrate for deposition. By providing a barrier, the baffle 240 provides a more uniform and consistent flow velocity across the tunnel, provides a smaller area for process gases to mix, directs the process gases towards the tunnel 206, and provides for a more uniform deposition of process gases. Improved deposition uniformity also has beneficial effects on deposition rate, because higher gas flow rates can be used without incurring flow non-uniformities.

As gas enters from the gas inlet 204, the gas contacts the baffle 260. A portion of the gas may flow towards the first portion 262 of the baffle 260. However, since the baffle has one opening 266, the gas contacts the baffle 260, begins to mix, and then continues to flow towards the opening 266 and after hitting the first end 208, the gas flows towards the tunnel 206. The tunnel 206 directs the flow of gas to the substrate for deposition.

In another implementation, baffle 260 may include a textured surface. In one implementation, the second portion 264 may be textured. In another implementation, the third portion 268, the second portion 264, and the first portion 262 may be textured. The textured surface may include small projections between about 25 microns and about 100 microns. The small projections may be uniform in size and shape or may vary randomly or according to any pattern. The small projections may be circular, square, rectangular, or any other geometric shape. In operation, as the gas flow contacts the second portion 264, the small projections may increase the dispersion of the gas along the second portion 264.

In the implementation of FIG. 2B, the baffle 250 has an opening 256 that faces the processing chamber. The baffle 250 has a first portion 252 that is connected to the wall 205 and extends from the wall 205 into the tunnel 206, and a second portion 254 attached to the first portion 252 at a distal end thereof, and extending orthogonal to the first portion 252 along the tunnel 206 directly across from the gas inlet 204. The second portion 254 extends toward the second end 210 of the tunnel 206 in the embodiment of FIG. 2B.

As gas enters from the gas inlet 204, it contacts the baffle 250. A portion of gas may flow towards the first portion 252 of the baffle 250. The first portion 252 may be adjacent the slit valve door. In other words, the opening 256 faces towards the front surface of the gas supply member. However, since the baffle has one opening 256, the gases contacts the baffle 250, begin to mix, and then continue to flow through the opening 256 and towards the tunnel 206. The tunnel 206 directs the flow of gas to the substrate for deposition. The baffle 250 has benefits similar to the baffle 240 in deposition uniformity and rate.

In the implementation of FIG. 2C, the baffle 260 has an opening 266 that faces the slit valve door or rear surface, similar to the implementation of FIG. 2A. The baffle 260 has a first portion 262 that is attached to the wall 205, a second portion 264, and a third portion 268. The second portion 264 is orthogonal the first portion 262 and extends into the tunnel 206 directly across from the gas inlet 204. The third portion 268 may be a lip, a small projection, a circular bump, or any shaped extension. The third portion 268 may be parallel to the first portion 262. The third portion 268 extends from a distal end of the second portion 264 toward the wall 205. The third portion 268 may extend from the second portion 264 at any angle. In one implementation, the third portion 268 extends from the second portion 264 at an angle greater than 90 degrees. In another implementation, the third portion 268 is curved. The third portion 268 is shown in FIG. 2C as being adjacent to the opening 266. In another implementation, the third portion 268 may be disposed anywhere on the second portion 264. For example, the third portion 268 may be disposed in the middle of the second portion 264. In another implementation, the third portion 268 may be disposed between the gas inlet 204 and the opening 266. In yet another implementation, the third portion 268 may be disposed between the gas inlet 204 and the first portion 262.

In the implementation of FIG. 2D, the baffle 270 is substantially similar to the baffle 240 of FIG. 2A. The second portion 274 is opposite an extension 278 disposed on the inner surface 212 of the tunnel 206 and extending into the tunnel 206. The extension 278 may be square, circular, rectangular, triangular, or any other geometric shape. In the implementation of FIG. 2D, the extension 278 is a singular piece. The extension 278 may be 3D printed or machined as part of the tunnel 206 or may be a separate piece attached to the tunnel 206. In another implementation, as illustrated in FIG. 2E, more than one extension 278 may be used. For example, two extensions 278 may be formed as two projections from the inner surface 212 of the tunnel 206. More than two projections may be disposed on the inner surface 212 of the tunnel 206, as illustrated in FIG. 2E. The extension 278 may have a textured surface. In one implementation, the extension 278 may be disposed in between the first end 208 of the tunnel 206 and the baffle 270. In another implementation, the extension 278 may overlap with the baffle 270. The extension 278 may be disposed along the inner surface 212 of the tunnel 206.

In the implementation of FIG. 2E, the baffle 280 includes a lip 288 and a projection 289 adjacent the lip 288. The projection 289 may be a separate piece attached to the second portion 284 of the baffle 280. The projection 289 may also be machined or 3D printed as one continuous piece of the baffle 280. The projection 289 may be square, circular, rectangular, triangular, or any other geometric shape. In the implementation of FIG. 2E, a single projection 289 is shown. In another implementation, the second portion 284 of the baffle 280 may include more than one projection 289. In the implementation of FIG. 2F, two projections 289 are shown. The baffle 290 may include between one and 20 projections. Each projection 289 may also include a textured surface. The projections 289 may be spaced anywhere along the second projection 294 of the baffle 290. For example, a first projection 289 may be adjacent the first portion of the baffle 290 while a second projection 289 may be adjacent the first end 208 of the tunnel 206. In the implementation of FIG. 2E, the projection 289, the lip 288, and the extension 278 form a saw-tooth configuration with the projection 289 and the lip 288 disposed on the second portion 284 of the baffle and the extension 278 disposed on the inner surface 212 of the tunnel 206. In other words, the lip 288 is disposed in between a first extension 278 and a second extension 278. Any number of extensions 278 and projections 289 may be included on the inner surface 212 of the tunnel 206 and the baffle 280, respectively.

By providing a barrier, the baffle provides a more uniform and consistent flow velocity across the tunnel, provides a smaller area for process gases to mix, directs the process gases towards the tunnel, and provides for a more uniform deposition of process gases.

While the foregoing is directed to embodiments of the disclosure, other and further embodiments may be devised without departing from the basic scope thereof, and the scope thereof is determined by the claims that follow.

What is claimed is:

1. A gas supply member comprising:
   a first side;
   a second side opposite the first side;
   an inner surface defining a first opening, the first opening extending between the first side and the second side;
   a third side orthogonal to the first side, the third side comprising:
      a first extension having a face partially defining the second side and comprising a first plurality of holes extending through the first extension to the face;
   a fourth side opposite the third side, the fourth side comprising:
      a protrusion, the protrusion having a face partially defining the second side; and
   a baffle disposed adjacent to the inner surface, the baffle comprising:
      a first portion extending from the inner surface;
      a second portion attached to the first portion, the second portion orthogonal to the first portion and parallel to the third side; and
      a cavity formed between the first portion and the second side
      a second plurality of holes formed in the third side, wherein the second plurality of holes is in fluid communication with the baffle.

2. The gas supply member of claim 1, further comprising a first angular surface extending from the third side to beyond the first opening, partially defining the second side.

3. The gas supply member of claim 2, wherein each of the first plurality of holes extends through the first angular surface.

4. The gas supply member of claim 2, further comprising a second angular surface extending from the face of the protrusion towards the first opening partially defining the second side.

5. The gas supply member of claim 4, further comprising a connecting surface between the first angular surface and the second angular surface.

6. The gas supply member of claim 1, wherein the protrusion has a second plurality of holes extending to the second side.

7. The gas supply member of claim 1, wherein the cavity comprises a first rounded corner and a second rounded corner.

8. The gas supply member of claim 1, wherein the second portion of the baffle has a textured surface.

9. The gas supply member of claim 8, wherein the textured surface comprises projections having a size of about 25 microns to about 100 microns.

10. A gas supply member comprising:
    a first side;
    a second side opposite the first side;
    an inner surface defining a first opening, the first opening extending between the first side and the second side;
    a third side orthogonal to the first side, the third side comprising:
       a first extension having a face partially defining the second side and comprising a first plurality of holes extending through the first extension to the face;
    a fourth side opposite the third side, the fourth side comprising:
       a protrusion, the protrusion having a face partially defining the second side; and
    a first angular surface extending from the third side, to beyond the first opening, partially defining the second side;
    a baffle disposed adjacent to the inner surface, the baffle comprising:
       a first portion extending from the inner surface; and
       a second portion attached to the first portion, the second portion has a textured surface, and the second portion orthogonal to the first portion and parallel to the third side; and
    a second plurality of holes formed in the third side, wherein the second plurality of holes is in fluid communication with the baffle.

11. The gas supply member of claim 10, wherein each of the first plurality of holes extends through the first angular surface.

12. The gas supply member of claim 10, further comprising a second angular surface extending from the face of the protrusion towards the first opening partially defining the second side.

13. The gas supply member of claim 12, further comprising a connecting surface between the first angular surface and the second angular surface.

14. The gas supply member of claim 10, wherein the textured surface comprises projections having a size of about 25 microns to about 100 microns.

15. The gas supply member of claim 10, wherein the baffle further comprises a cavity formed between the first portion and the second side.

16. A gas supply member comprising:
    a first side;
    a second side opposite the first side;

an inner surface defining a first opening, the first opening extending between the first side and the second side;
a third side orthogonal to the first side, the third side comprising:
a first extension having a face partially defining the second side and comprising a first plurality of holes extending through the first extension to the face;
a fourth side opposite the third side, the fourth side comprising:
a protrusion, the protrusion having a face partially defining the second side; and
a baffle disposed adjacent to the inner surface, the baffle comprising:
a first portion extending from the inner surface;
a second portion attached to the first portion, the second portion orthogonal to the first portion and parallel to the third side;
a cavity formed between the first portion and the second side; and
a second plurality of holes formed in the third side, wherein the second plurality of holes are fluidly coupled to the baffle by a gas inlet.

17. The gas supply member of claim 16, further comprising a first angular surface extending from the third side to beyond the first opening, partially defining the second side.

18. The gas supply member of claim 17, wherein each of the first plurality of holes extends through the first angular surface.

19. The gas supply member of claim 17, further comprising a second angular surface extending from the face of the protrusion towards the first opening partially defining the second side.

* * * * *